United States Patent [19]
Titus et al.

[11] Patent Number: 5,825,307
[45] Date of Patent: Oct. 20, 1998

[54] ABSOLUTE LINEAR ENCODER AND METHOD OF PRODUCTION UTILIZING INDEX AND COUNTER CHANNELS

[75] Inventors: John Titus, Prior Lake; Paul R. Meyer, St. Paul, both of Minn.

[73] Assignee: Perception Incorporated, Prior Lake, Minn.

[21] Appl. No.: 796,102

[22] Filed: Feb. 5, 1997

[51] Int. Cl.$^6$ .................................................. H03M 1/22
[52] U.S. Cl. .................................... 341/13; 341/2; 341/9; 341/11
[58] Field of Search .................... 341/2, 9, 11, 13

[56] References Cited

U.S. PATENT DOCUMENTS

| | | | |
|---|---|---|---|
| 4,524,347 | 6/1985 | Rogers | 340/347 |
| 4,794,251 | 12/1988 | Scholian | 341/9 |
| 4,901,073 | 2/1990 | Kirbrick | 341/13 |
| 4,914,437 | 4/1990 | Kirbrick et al. | 341/3 |
| 5,027,526 | 7/1991 | Crane | 33/763 |
| 5,127,035 | 6/1992 | Ishii | 377/24 |
| 5,336,884 | 8/1994 | Khoshnevisan et al. | 250/231.18 |
| 5,418,362 | 5/1995 | Lusby et al. | 250/231.18 |
| 5,438,193 | 8/1995 | Takagi et al. | 341/13 |
| 5,438,330 | 8/1995 | Yamazaki et al. | 341/11 |
| 5,451,776 | 9/1995 | Kolloff et al. | 250/231.18 |
| 5,563,408 | 10/1996 | Matsumoto et al. | 250/231.14 |

FOREIGN PATENT DOCUMENTS

| | | | |
|---|---|---|---|
| 43 06 634 A1 | 9/1993 | Germany | H03M 1/22 |
| 2 236 858 A | 4/1991 | United Kingdom | G01B 07/02 |

*Primary Examiner*—Jeffrey A. Gaffin
*Assistant Examiner*—Kim N. Huynh
*Attorney, Agent, or Firm*—Merchant, Gould, Smith, Edell, Welter & Schmidt, P.A.

[57] ABSTRACT

An absolute linear encoder includes an index channel and at least two counter channels. The spacing between markings on the index channel is constant, and the spacing between markings on the first and second channels is predetermined so that the positions of the markings in the first and second channels vary so as to provide a unique signature for each position along the encoder. The linear encoder includes quadrature channels to provide increased resolution and to determine the direction of translation. The encoder is provided with a detector unit to detect positions of the markings in each channel, and a processing unit to calculate an absolute position from the detected marking positions. A method of producing the absolute linear encoder includes selecting spacings for markers in the quadrature, index, first and second channels in order to provide a desired resolution and encoder length.

28 Claims, 6 Drawing Sheets

ABSOLUTE LINEAR ENCODER AND METHOD OF PRODUCTION UTILIZING INDEX AND COUNTER CHANNELS

BACKGROUND OF THE INVENTION

1. Field of the Invention

This invention relates in general to an apparatus for measuring position and, in particular, to an absolute linear encoder.

2. Description of Related Art

Position encoders generally fit into one of two categories: relative or incremental and absolute. An incremental encoder measures the distance moved from a starting position, and hence relies entirely on stored information. If any of the stored information is lost, or if the distance measurement is faulty, the resulting position indicated by the encoder is erroneous. An absolute encoder uses an output which is unique for any particular position, and updates its position frequently. The absolute encoder is thus less dependent on the use of stored information and is therefore generally more reliable than the incremental encoder.

Existing absolute linear encoders are limited in that, if the absolute position is unknown, a large translation is required, in some cases up to several inches, before the absolute position can be determined. Moreover, it is difficult to achieve more than 13 bit resolution with many absolute linear encoder designs.

Most existing absolute linear encoders are magnetically or optically based and have a resolution on the order of 0.0001 inches or 0.001 mm. These encoders have a resolution which is unnecessarily high for many applications, and are therefore prohibitively expensive for such applications. Also, long travel, in the approximate range of 10 feet to several hundreds of feet, is not plausible with existing absolute linear devices. Most absolute linear devices are based on the use of a rotary decoder, the so-called "yo-yo" device, providing only 360° of travel. Some absolute linear encoders use a potentiometer to produce a change in resistance corresponding to a linear position change, for example where the linear displacement is measured by a cable rolled off a drum. This approach requires the use of an analog to digital converter and is subject to inaccuracies due to temperature changes and aging. This approach also sacrifices accuracy and resolution as distance increases, due to gear reductions from the multi-turn drum to the single turn potentiometer.

Therefore, there exists a need to produce a medium resolution absolute encoder where the distance required to determine an absolute position is short. Additionally, the absolute linear encoder should be capable of operating over a large displacement range, be stable against temperature changes and aging, and produce repeatable position measurements, and not sacrifice accuracy and resolution with increasing measuring range.

SUMMARY OF THE INVENTION

To overcome the deficiencies in the prior art described above, and to minimize other limitations that will become apparent upon reading and understanding the present specification, the present invention is directed to an absolute linear encoder and a method for producing same, where the linear encoder includes an index channel and at least two counter channels along a strip. The spacing between markings on the index channel is constant, and the spacing between markings on the first and second channels is predetermined so that the positions of the markings in the first and second channels vary so as to provide a unique signature for each position along the strip. The linear encoder includes quadrature channels to provide increased resolution and to determine the direction of translation. The encoder is provided with a detector unit to detect positions of the markings in each channel, and a processing unit to calculate an absolute position from the detected marking positions.

A method of producing an absolute linear encoder includes selecting spacings for markers in the quadrature, index, and a first channel in order to provide a desired resolution and encoder length.

The addition of counter channels allows the encoder length to be increased and the relative resolution to be improved.

The quadrature channels may advantageously be combined into a single quadrature channel to reduce the overall width of the encoder, and two quadrature signals may be generated by judicious positioning of two quadrature detectors.

The starting positions of the channels may be staggered in order to reduce the overall width of the encoder while using detectors whose width is greater than the width of a single channel.

The encoder may determine an absolute position with a translation of only a single counter channel period and the index channel for a system using four detectors.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following description of the preferred embodiment, reference is made to the accompanying drawings which form a part hereof, and in which is shown by way of illustration various embodiments in which the invention may be practiced. It is to be understood that other embodiments may be utilized and structural changes may be made without departing from the scope of the present invention.

In the following description, the terms "spacing" and "separation", with respect to a linear encoder scale, refer to the center-to-center spacing between adjacent markings positioned along a channel or, equivalently, the spacing between leading edges of the markings. The terms "spacing" and "separation" are not intended to refer to the distance between the trailing edge of a first mark and the leading edge of an adjacent second mark.

The intent of the invention described herein is to allow a user to determine the absolute position of a detector placed at any point along a measuring strip. The absolute linear encoder employs a number of channels, where each channel includes a series of markings in a repeated pattern. Since each channel has its own specific repeated pattern of markings, the relative position of markings in a direction along the encoder is unique for each location along the encoder. Detection of this unique combination of marking positions allows determination of an absolute position along the encoder.

Figure 1:
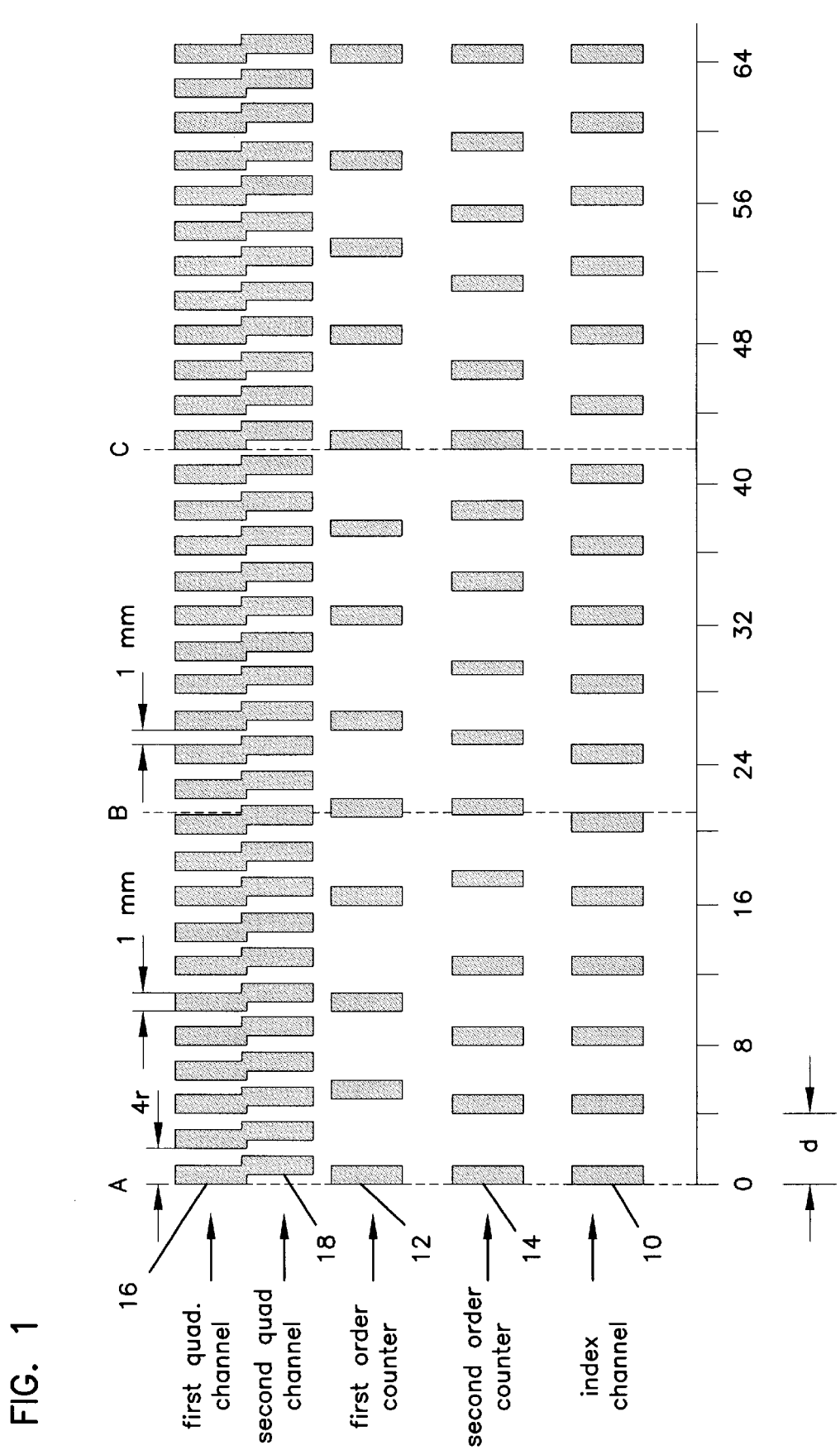
FIG. 1 illustrates a first embodiment of a linear encoder scale according to the present invention.

FIG. 1 illustrates a plurality of channels of markings. The channels of markings may, for example, be placed on a tape measure, or along a position slide for a saw head in a sawmill. An index channel 10 is a series of markings each spaced from its neighbor by a uniform separation. The separation, d, is referred to as the base distance, and the width of each marking is given by 2r, where r is the resolution distance. The base distance, d, is approximately an even integer multiple of the resolution distance r, so that N=d/2r, where N is the integer.

The first order counter channel 12 has markings whose spacings are different from those of the index channel 10. Typically, the markings of the first order counter channel 12 form a repeated pattern where the intermarking spacing is d+2r repeated N−2 times followed by one intermarking spacing of d+4r. This pattern is repeated throughout the length of the first order counter channel 12. For the example shown in FIG. 1, d=4 mm, 2r=1 mm, and N=4. The pattern for the first order counter includes two (N−2) spacings, each being 5 mm (d+2r), followed by one spacing of 6 mm (d+4r).

The second order counter channel 14 is provided with a series of markings having a repeated pattern that is different from the pattern of the first order counter channel 12. The reversed order counter channel 14 includes an intermarking separation of d repeated N−1 times, followed by an intermarking spacing of d+2r for one intermarking spacing. This pattern is repeated throughout the length of the second order counter channel 14. For the example illustrated in FIG. 1, the second order counter channel has markings spaced with a periodic pattern of three (N−1) spacings of 4 mm (d) followed by one spacing of 5 mm (d+2r).

The markings in the first order counter channel 12 fall in step with the markings of the index channel 10 at every Nth index channel marking. The fourth (Nth) index channel marking from the original index channel marking at 0 mm is at 16 mm. The first order counter is in step with the index counter at 0 mm and 16 mm. The first order counter falls in step with every subsequent fourth index channel marker (e.g., at 32 mm and 48 mm).

The markings of the second order counter 14 remain in step with the index channel for the first N−1 spacings from 0 (e.g., up to position 12 mm in FIG. 1). The second order counter channel 14 first falls out of step with the index channel marker 10 on the Nth index channel marker from the origin, at a distance of 16 mm. Thus, at a distance of 16 mm from the origin, where the first order counter channel 12 and the index channel 10 are in step, the second order counter channel 14 is out of step. The markings of the second order counter channel 14 progressively fall further out of step with the index channel 10 by one extra marking width for every N index channel markers. Thus, at position 32 mm, the second order counter channel 14 is out of step from the index channel 10 by two marker widths, and out of step from the index channel 10 by three marker widths at position 48 mm.

The second order counter channel 14 falls back into step with the index channel 10 at position 64 mm. The first order counter markings also fall in step with the index channel 10 at position 64 mm, since position 64 mm is a multiple of N times the index channel markings. The pattern of channel markings 10, 12, 14 repeats itself after position 64 mm.

For each location between 0 mm and 64 mm, the markings in each channel have a unique set of positions relative to that location. Therefore, this configuration has a maximum range of 64 mm. The use of a detector to detect the channel markings at any position between 0 mm and 64 mm allows for absolute determination of that position. For example, at line B, illustrated at position 21 mm, the markings in the first order counter channel 12 and the second order counter channel 14 are in step. The index channel is out of step with the first and second order markings by one marker width. The next position where the markings on the first order and second order counter channels 12 and 14 are in step is shown as line C, position 42 mm. At 42 mm, the marker for the index channel 10 is out of step with the other counter channels 12 and 14 by two marker widths. Thus, the position B measured by a detector using the index channel 10 and the first and second counter channels 12 and 14 is unique in the range 0–64 mm.

Consider now the quadrature channels 16 and 18. The first quadrature channel 16 includes a series of markings similar in width to those of the index and counter channels 10, 12, and 14. The width of each marking is equal to 2r, 1 mm for the example illustrated in FIG. 1. The spacing between markings in the first quadrature channel is equal to 4r=2 mm in the current example. The second quadrature channel 18 includes a series of markings similar to those of the first quadrature channel 16, each having a width of 2r, and a spacing of 4r between adjacent markings, but out of step with the first quadrature channel 16 by r (90°). The first and second quadrature channels are used to determine the position of a detector within the spacing between two index channel markers. Use of the index and counter channels 10, 12, and 14, along with only one quadrature channel, results in the determination of position along the strip with a precision of 2r, i.e. the width of a marking. The second quadrature channel 18 improves the achievable resolution to r. If the base period is defined to be the spacing between index channel markers, then there are N/2 quadrature channel markers within the base period for each quadrature channel 16 and 18.

The position along the absolute linear encoder strip may be determined to within a resolution of r by detecting the presence of a quadrature marking. Consider moving from the origin, 0 mm, to the 2 mm position. The signal from the quadrature channels 16 and 18 may initially be presented as (1,0) where the first digit represents the first quadrature channel 16 and the second number represents the second quadrature channel 18. A "1" represents the presence of a marking and a "0" represents the absence of a marking. As the detector is moved from the 0 mm position, the quadrature signal changes to (1,1) between 0.5 mm and 1.0 mm, (0,1) between 1.0 mm and 1.5 mm, and (0,0) between 1.5 mm and 2 mm. At 2.0 mm, the quadrature signal returns to (1,0). Thus, the use of the quadrature channels 16 and 18 allows the determination of position to within a resolution of r=0.5 mm for this example. Additionally, the sequence of signals from the quadrature channels 16 and 18 obtained by moving a detector along the strip allows the determination of which direction the detector is being translated along the strip. For example, the sequence of detected quadrature signals . . . (1,0), (1,1), (0,1), (0,0), (1,0) . . . indicates movement from left to right, whereas detection of the quadrature signal sequence . . . (1,0), (0,0), (0,1), (1,1), (1,0) . . . indicates movement from right to left.

Figure 2:
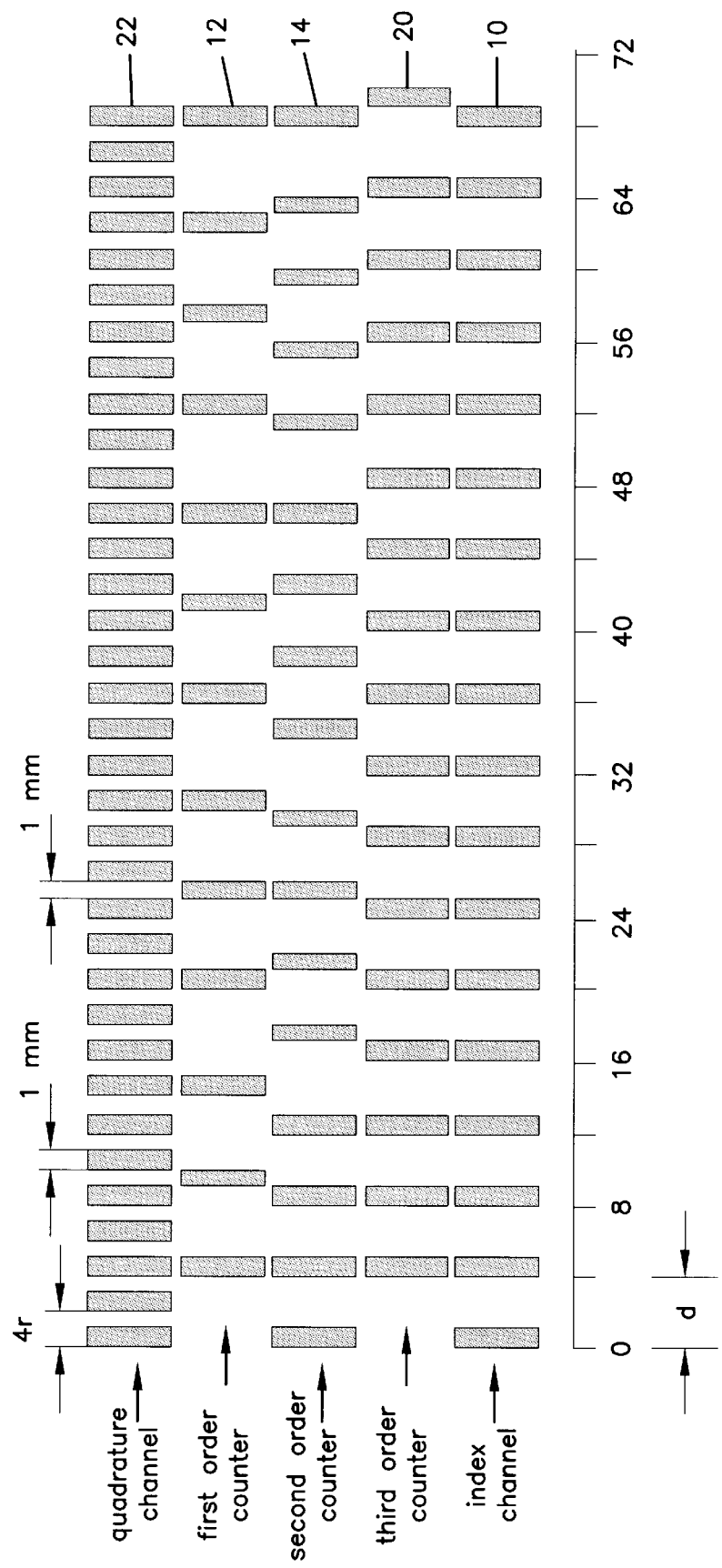
FIG. 2 illustrates a second embodiment of a linear encoder scale according to the present invention.

In FIG. 2 there is illustrated a second embodiment of an absolute linear encoder. The second embodiment includes a single quadrature channel 22, and a third order counter channel 20. The first order counter channel 12 and the third order counter channel 20 are shown to start in a position staggered from the origin at 0.

The quadrature channel 22 is similar to the first quadrature channel 16 of FIG. 1. The single quadrature channel 22 yields the same position resolution and direction detection as the first and second quadrature channels 16 and 18 by employing two detectors, longitudinally separated along the single quadrature channel 22 by a distance equal to an odd integer multiple of r, in other words a spacing equal to (2m+1)r, where m is an integer.

A third order counter channel 20 is provided for extending the range over which the linear encoder pattern provides unique position information. The third order counter channel 20 includes a series of markings similar in width to the other counter channels 12 and 14. The spacing between adjacent markings forms a repetitive marking pattern where the spacing is equal to d for $N^2-1$ repetitions, followed by a spacing of d+2r for one spacing. Thus, the third order counter channel 20 falls out of step with the index channel after 16 ($N^2$) spacings. The third order counter channel 20 continues to increment by one marking width every $N^2$ index marker spacings, and thus the overall linear encoder pattern does not repeat for $N^3$ index channel markings. The addition of the third order counter channel 20 increases the length over which the absolute linear encoder provides a unique position measurement. For example, in the illustrated example incorporation of the third order counter effectively increases the length over which the linear encoder provides a unique position measurement to 256 mm.

A fourth order counter channel (not illustrated) may be added having a repeated pattern of $N^3-1$ spaces with a separation of d, followed by a single spacing of d+2r. The fourth order counter channel pattern may be repeated N times to extend the unrepeated length of the absolute linear encoder pattern to $N^4$ base periods. If such a fourth order counter were to be added to the absolute linear encoder of the second embodiment, then the absolute linear encoding pattern would be unique for positions up to 1,064 mm, for the selection of d=4 mm and r=0.5 mm. Additional counter channels may be added to extend the range of the encoder. The ith counter channel includes a repeated pattern of $N^{i-1}-1$ spaces of separation d, followed by a single spacing of d+2r. The ith counter channel allows the extension of the unrepeated length of the encoder pattern to $N^i$ base periods.

The first and third order counter channels 12 and 20 are illustrated to start at staggered positions, displaced 4 mm from the origin of 0 mm. Having adjacent channels starting at staggered positions advantageously permits the use of detectors to be used for detecting the position of a mark on a channel, where the detectors are each wider than the spacing between adjacent channels. This is further described with reference to FIG. 4 below.

Figure 3:
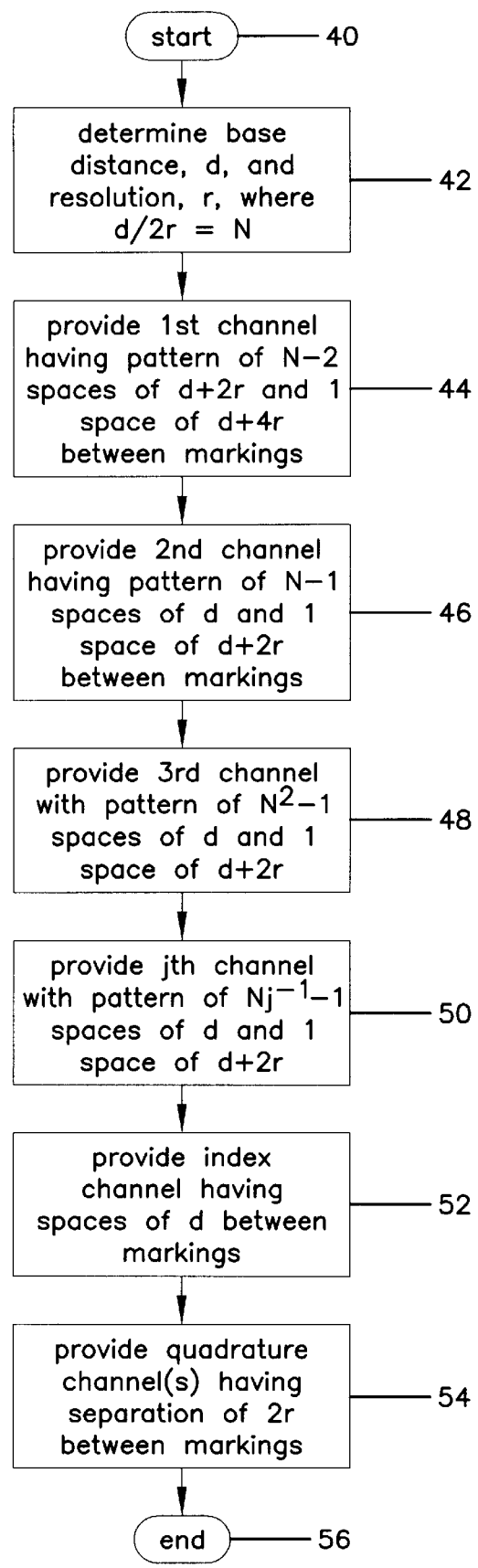
FIG. 3 illustrates logical steps in designing the scale of a linear encoder according to the present invention.

In FIG. 3 there is illustrated a generalized method of developing the pattern for the absolute linear encoder of the second embodiment as shown in FIG. 2. Initially, the user determines values for the base distance, d, and the resolution, r, under the constraint that d/2r is equal to an integer N, in step 42. The first order counter channel is determined to have a pattern of N−2 spaces of length d+2r between markings followed by one space of length d+4r between markings, that pattern being repeated as often as is necessary, in step 44. The second order counter channel is determined to have a pattern of N−1 spaces of separation d followed by one space of separation d+2r between the markings, in step 46. The third order counter channel is determined to have a repeating pattern of $N^2-1$ spaces of separation d and followed by one space of separation d+2r, in step 48. Any additional ith order counter channel is determined to have a repeating pattern of $N^{(i-1)}-1$ spaces of separation d, followed by one space of separation d+2r, in step 50. The index channel is provided to have spacings between adjacent markings of d throughout the entire length of the absolute linear encoder, in step 50. A quadrature channel having markings with a separation of 2r is provided, in step 52.

Figure 4:
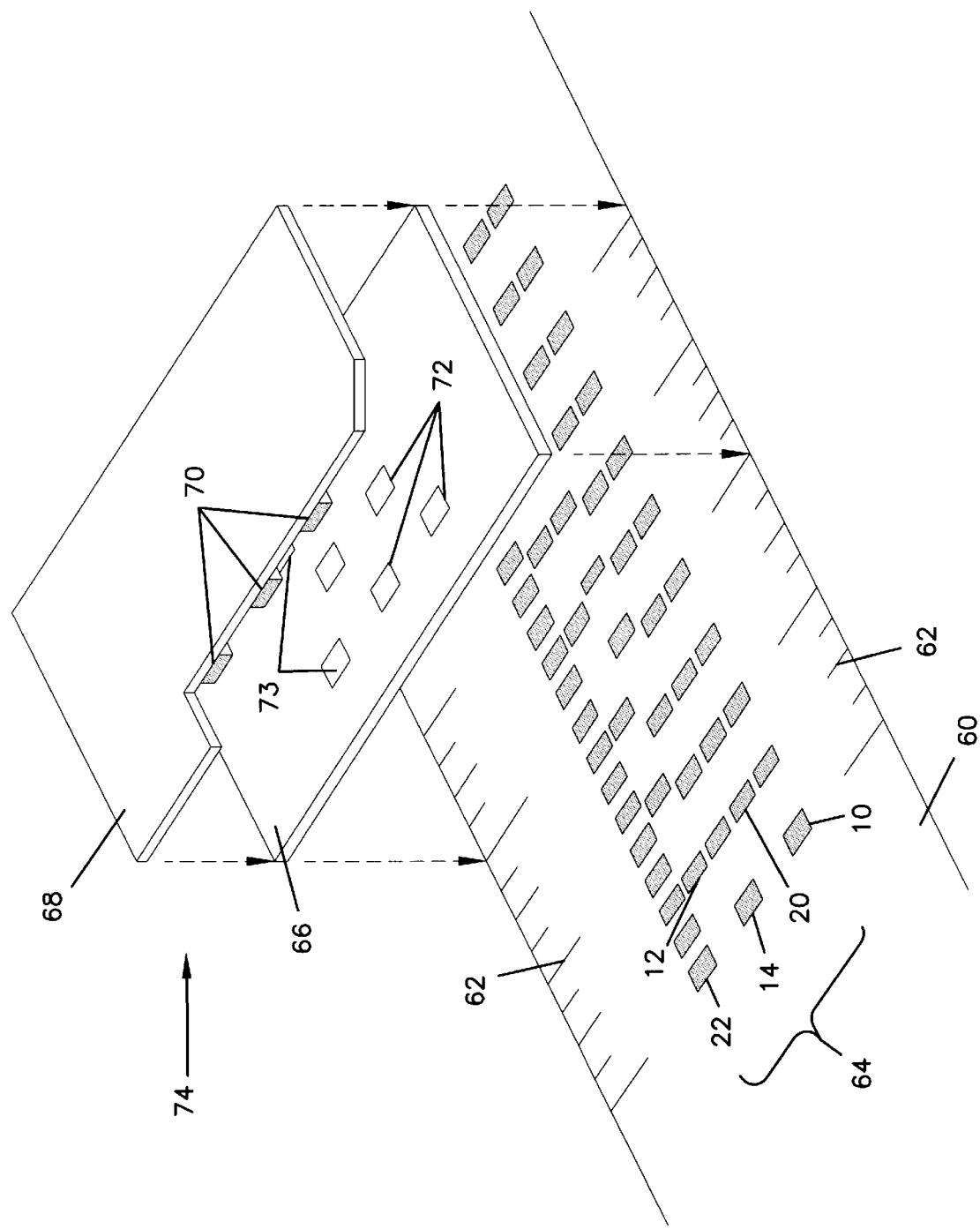
FIG. 4 illustrates an embodiment of an absolute linear encoder.

FIG. 4 illustrates an implementation of the absolute linear encoder illustrated in FIG. 2. A tape 60, having marked gradations 62 along the edges for the user to measure distances, includes an absolute linear encoder section 64 along a central portion of the tape 60. An aperture plate 66 is positioned above the tape 60, and a detector unit 68 is positioned above the aperture plate 66. The detector unit 68 includes a plurality of detectors 70 which are located in apertures 72 in the aperture plate 66. The aperture plate 66 includes two apertures 73 in alignment with the quadrature channel 74 and one aperture for each of the index and counter channels 10, 12, 14 and 20. In the illustrated embodiment, the sensors 70 include a photodetector, such as a phototransistor, along with a light emitting diode. Each channel is illuminated by its respective sensor through its respective aperture 72. The aperture plate 66 prevents crosstalk between a light emitting in one sensor 70 being detected by the phototransistor in a second sensor 70. Additionally, the aperture plate 66 may include optical filters at each aperture 72 in order to enhance the contrast between light and dark spaces of each channel. As the detector head 74, including the aperture plate 66 and detector unit 68, is moved along the tape 60, each detector 70 detects a signal in response to the markings on its respective channel 10, 12, 14, 20, and 22. A processor processes signals received from each detector to produce an absolute position measurement, as is discussed hereinbelow.

Figure 5:
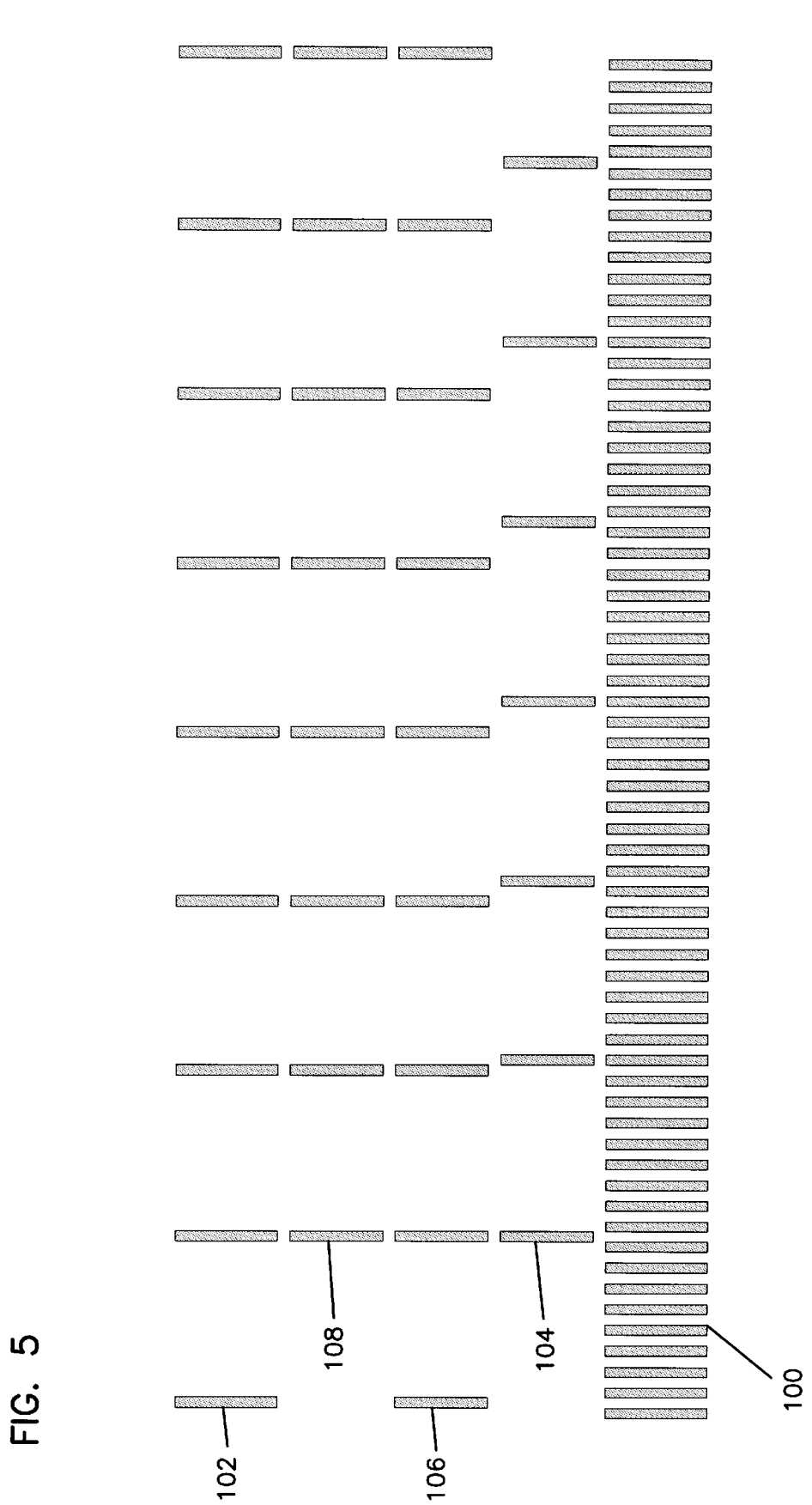
FIG. 5 illustrates a third embodiment of a linear encoder scale according to the present invention.

FIG. 5 illustrates a portion of another embodiment of the linear encoder. The single quadrature channel 100 employs two quadrature detectors positioned out of phase by 90° along the direction of the quadrature channel 100. The quadrature channel 100 includes markings 0.5 mm wide and spaced regularly by 1 mm. The index channel 102 includes markings 0.5 mm wide and spaced regularly by 8 mm. The embodiment also includes first, second and third order counter channels 104, 106 and 108 respectively. The starting positions of the first and third order counter channels 104 and 108 are staggered from the start of the other channels 100, 102 and 106, in a manner similar to that discussed with regard to the embodiment of FIG. 2. This embodiment of an absolute linear encoder demonstrates the properties of d=8 mm, r=0.25 mm, and N=16, and thus the maximum length of this embodiment, without repeating, is $N^3 \times 8$ mm=32.8 m.

Figure 6:
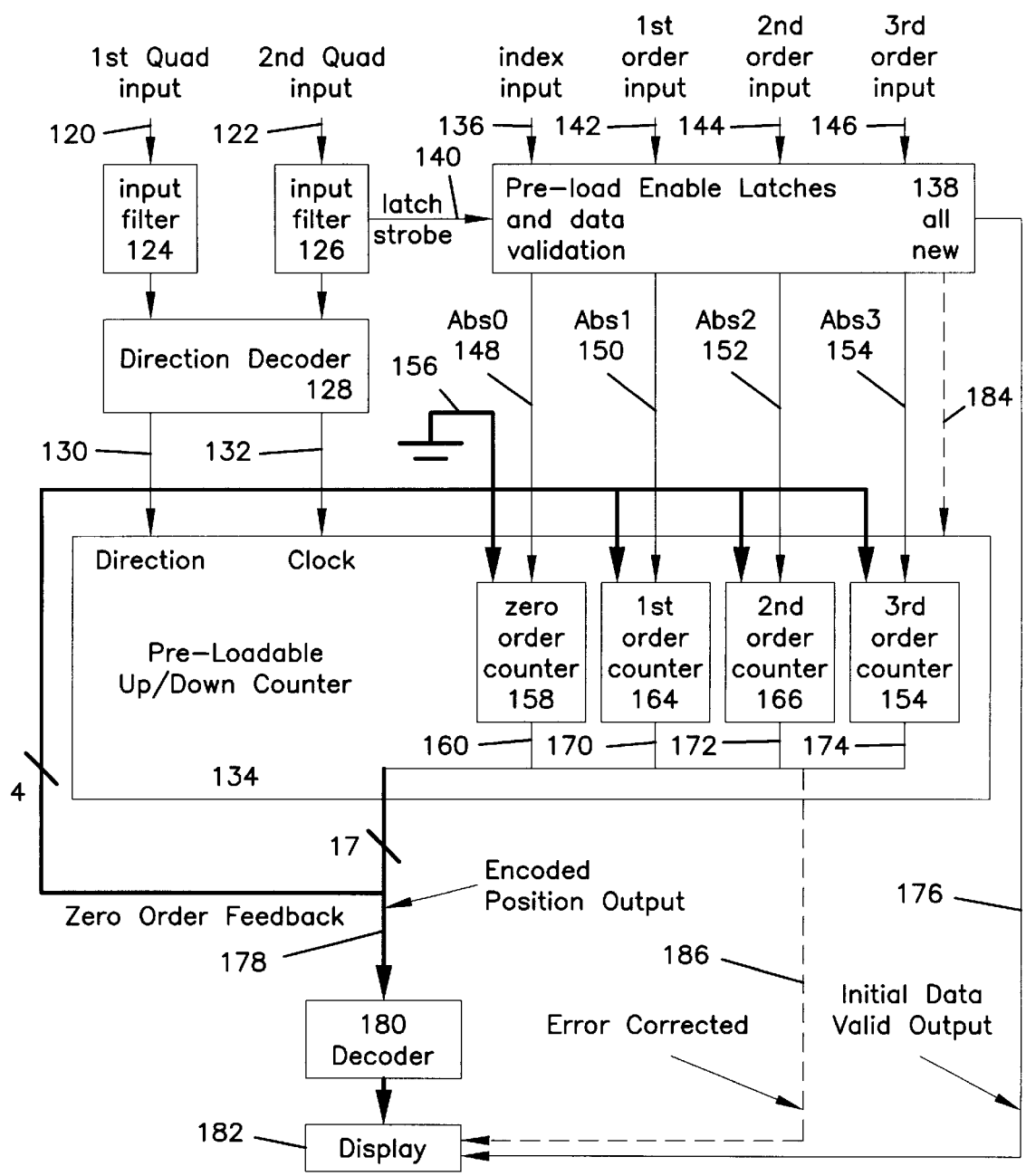
FIG. 6 illustrates a block schematic of a detector circuit in an absolute linear encoder.

FIG. 6 illustrates a block diagram circuit for determining the absolute position of a detector unit positioned along the absolute linear encoder of FIG. 5. The first and second quadrature inputs 120 and 122 are derived from sensors 70 aligned along the quadrature channel 100. If the sensors 70 include light emitting diodes and phototransistors, then the first and second quadrature inputs 120 and 122 are typically received from buffered phototransistor signals. The first quadrature input 120 and the second quadrature input 122 are each preferably directed to respective input filters 124 and 126. The input filters 124 and 126 are typically digital sampling filters that are employed to reduce the effect of jitter, and to prevent the direction decoder 128 from triggering on a false signal, as may happen when the phototransistors detect the edge of a marking.

The direction decoder 128 generates a direction output 130 and a clock output 132. The direction output 130 indicates which direction the detector unit is moving relative to the absolute linear encoder, either up or down, for example. The direction decoder 128 transmits a signal on the clock output 132 each time that either one of the first and second quadrature inputs 120 and 122 changes. The clock output may, for example, be generated whenever a rising edge is detected on either of the first and second quadrature inputs 120 and 122. The direction output 130 and the clock output 132 are communicated to a pre-loadable up/down counter 134.

The index input 136 is obtained from the sensor sensing the index channel 102, and is directed to the pre-load enable latches and data validation circuit 138 (latch enable circuit). The index input may be provided with a digital sampling filter to remove jitter on the signal. The latch enable circuit 138 receives a latch strobe signal 140 from the input filter 126 of the second quadrature input 122 which is (90°) out of phase with the other markings on the encoder. Thus, when the input filter 126 positively detects the leading edge of a 90° quadrature marking, the latch enable circuit 138 is strobed to accept any index input signal at that point. If the sensor for the index counter channel 102 is at a marking, it is located at the center point of the marking when an edge is confirmed by the input filter 126. The first order input 142, second order input 144 and third order input 146 are each transmitted to the latch enable circuit 138 from respective sensors on the first, second and third order channels 104, 106 and 108, in a manner similar to the index input 136. The latch enable circuit 138 produces outputs abs0 148, abs1 150, abs2 152 and abs3 154 in response to the index input 136, the 1st order input 142, the second order input 144 and the third order input 146, respectively.

If the detector unit is initially at an unknown location along the absolute encoder strip, the position determining circuit determines the absolute position of the detector unit in the following manner. The detector unit is moved in one direction, either up or down the absolute encoder strip. The direction decoder 128 transmits direction and clock signals 130 and 132 to the pre-loadable up/down counter 134 (counter) as described hereinabove. The latch enable circuit 138 receives signals from the inputs 136, 142, 144 and 146, but does not transmit any output signal until an index input signal 136 is detected. Upon detecting an index input signal 136, the latch enable circuit 138 transmits an abs0 signal 148 latch signal to the counter 134, resulting in the ground signal 156 being pre-loaded into the zero order counter 158 of the counter 134 to initialize the zero order counter 158 at zero. As the detector unit is moved, the zero order counter 158 is incremented or decremented by the clock input signal 132.

The zero order counter 158 transmits its current count as the zero order count signal 160. The zero order count signal 160 has 5 output bits, since $d/r=2^5$. The four highest order bits of the zero order count signal 160 are fed back, as the zero order feedback signal 162, to each of the first, second and third-order counters 164, 166 and 168. When the abs1 signal 150 flags the detection of a mark on the first order counter channel 104, the first order counter 164 is loaded with the current value of the zero order feedback signal 162. Likewise, the second and third order counters 166 and 168 are each loaded with the value of the zero order feedback signal 162 existing at the time when the abs2 signal 152 and abs3 signal 154 respectively flag the presence of a mark on the second order counter channel 106 and the third order counter channel 108. The first, second, and third order outputs 170, 172 and 174 each contain 4 output bits since $d/2r=2^4$. The zero to third order outputs 160, 170, 172 and 174 together form a coded absolute position output 178. The coded absolute position output 178 is converted to an absolute measurement in a decoder 180 using, for example, a look-up table or a conversion algorithm to provide the user with an absolute measurement of position. The decoder 180 takes account of the direction signal 130 in order to determine the absolute position. The absolute position is then transmitted to a display 182, such as a liquid crystal, multi-digit, seven segment display. Using this circuit, the detector need not be moved more than a distance of 2d in order to determine the absolute position of the detector unit.

Once all the 1st–3rd order inputs 142, 144 and 146 have been received by the latch enable circuit 138 after an index input 136 is received, the latch enable circuit 138 may transmit an initial data valid output signal 176 that may be used, for example, to activate the display 182. Such an initial data valid output signal 176 may be used to prevent the display 182 or a control system from showing or using a position which has not been determined using the process described hereinabove. The latch enable circuit 138 may direct an "all new input" signal 184 (dotted line) to the counter 134 each time a complete new set of abs0–abs3 inputs 148, 150, 152 and 154 has been transmitted.

Once an absolute position has been determined, the counter 134 continues to count by incrementing the zero order counter 158. When the next marker on the index channel 102 is detected, the zero order counter 158 is preferably again pre-loaded with a zero by latching to the ground signal 156, and the other counters 164, 166 and 168 preferably loaded with the current zero order feedback signal 162 when their respective abs1 150, abs2 152 and abs3 154 signals enable a latch. Thus, the absolute position is preferably recalculated from the markings on all the counter channels 104, 106 and 108 for each index marker spacing on the index channel 102. Such an approach is preferable to establishing a first absolute position and thereafter simply counting clock signals from that first absolute position, since this approach significantly reduces the possibility of possible mis-measurement of position, such as by accumulating a large number of missed clock signals.

The absolute position determined by the decoder 180 and displayed on the display 182 is updated on a fine scale and a course scale. Fine scale updating is achieved by adding to the last-calculated absolute position the change in position calculated from the number of clock pulses since the last-calculated absolute position was established. Since each clock pulse is related to an incremental movement of r, fine scale updating is achieved at the resolution limit. Thus, updating on a relative basis is performed for detector translations of the order of r. Course scale updating is achieved by calculating a new absolute position from an updated set of inputs 136, 150, 152 and 154. Thus the position is updated on an absolute basis approximately every index marker spacing, d.

The counter 134 may compare a newly established absolute position with an expected position calculated from the previously-calculated absolute position and the translation calculated from the detected clock cycles. If there has been no error, the comparison will show equal positions. However, if an error has occurred, for instance a clock cycle has been missed, then an "error corrected" signal 186 may be directed to the display to indicate to the user that an error has occurred in the position measurement and that the error has been corrected.

The following example illustrates a procedure for determining how the coded absolute position output 178 is determined. Initially, it is assumed that the marking on the first order counter channel 104 is positioned two mark widths past the marking on the index channel 102, and the markings on the second and third order channels 106 and 108 are respectively positioned four and nine mark widths past the marking on the index channel 102. Thus, after the marking on the index channel 102 is detected, the zero-order counter 158 is set to '0', and translation of the detector continues. The next marking to be detected is the marking in the first order counter channel 104, which is detected when the zero-order counter has been incremented to '4'. The zero order feedback signal 162 carries the value of the four most significant bits from the zero order counter 158, and so the first order counter is loaded with the count in the zero order counter 158 divided by two. Thus, the first order counter is loaded with the value '2'.

The marking on the second order counter channel 106 is detected when the zero order counter has been incremented to '8'. Therefore, the second order counter 166 is loaded by the zero order feedback with the value '4'. The marking on the third order counter channel 108 is detected when the zero order counter has been incremented to '18'. Therefore, the third order counter 168 is loaded by the zero order feedback with the value '9'. The values '18', '2', '4', and '9' are directed to the decoder 180 from the index and first-third order counters 158, 164, 166 and 168, as the encoded absolute position output signal 178. The decoder 180 then decodes the input to determine the absolute position of the detector unit.

The following paragraphs describe some alternative methods of accomplishing the same objects. First, an absolute linear encoder may be provided according to the present invention using values of r and d which are different from the examples shown herein. Second, the embodiments described above are directed to optical detection of markings on the linear encoder 64. Optical detection is shown for illustration only and is not intended to limit the invention. The markings in the absolute linear encoder 64 may take different forms. For example, instead of the markings optically contrasting with the background and the markings being illuminated and detected from the same side of the tape 60, the markings may be formed as slots in a backing, and the detectors positioned on the other side of the backing from the illumination. Alternatively, the markings may be formed magnetically and sensed using magnetic sensors, or the markings may be holes in the tape which are detected electromechanically by forming an electrical current path through the holes. The markings may also be bumps or pits in the tape which are detected mechanically. Other types of markings may also be used. Third, counter logic, that is different from that illustrated, may be implemented for determining absolute position.

In summary, an absolute linear encoder has been described which enables a user to determine the absolute position of a detector unit at any point along the encoder. The encoder does not rely on determining a single start point and then determining position relative to that single start point. Instead, the encoder determines a series of absolute points and determines position relative to the most recently detected absolute point. Thus, the absolute linear encoder is significantly less likely to accumulate error than a relative encoder. Also, the linear encoder permits position to be determined over long distances—over hundreds of feet or more—while maintaining medium resolution (fractions of an inch).

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for manufacturing an absolute position encoder, comprising the steps of:

providing a first channel of first markings on the encoder in a first repeated pattern having N−2 spaces of d+2r between first markings followed by a single space of d+4r between first markings;

providing an index channel on the encoder comprising index markings separated by d;

wherein d is a base distance, r is a resolution distance and N is equal to d/2r.

2. The method of claim 1, comprising the further step of providing a second channel of second markings on the encoder in a second repeated pattern having N−1 spaces of d between second markings followed by a single space of d+2r between second markings.

3. The method of claim 1, comprising the further step of providing a first quadrature channel on the encoder comprising first quadrature markings separated by 2r.

4. The method of claim 3, comprising the further step of providing a second quadrature channel on the encoder comprising second quadrature markings separated by 2r and shifted in position along the encoder by r relative to the first quadrature channel markings.

5. The method of claim 1, further comprising the step of providing sensors along the first quadrature channel, spaced apart by (2m+1)r, where m is an integer.

6. The method of claim 1, comprising the further step of providing a detector unit to detect positions of the markings of the channels and a processor to determine absolute position in response to detected marking positions.

7. The method of claim 1, comprising the further step of providing a third channel of third markings on the encoder in a third repeated pattern having $N^2-1$ spacings of d between third markings followed by a single space of d+2r between third markings.

8. The method of claim 1, comprising the further step of providing photosensors in the detector unit to detect positions of the markings.

9. An absolute linear encoder, comprising:

a marked region;

a first channel on the marked region comprising a series of first markings in a first repeated pattern having N−2 spaces of d+2r between first markings followed by a single space of d+4r between first markings;

an index channel on the marked region comprising index markings separated by d;

a detector unit to detect positions of the markings in each channel and to produce detection signals in response to the positions detected; and a processing unit to receive the detection signals from the detector unit and to determine an absolute position of the detector in response to the detection signals;

wherein r is a resolution distance, d is a base measurement distance, and N is an integer given by N=d/2r.

10. The encoder of claim 9, further comprising a second channel of second markings in a second repeated pattern having N−1 spacings of d between second markings followed by a single space of d+2r between second markings.

11. The encoder of claim 9, further comprising a third channel on the marked region comprising a series of third markings in a third repeated pattern having $N^2-1$ spacings of d between second markings followed by a single space of d+2r between second markings.

12. The encoder of claim 9, wherein the detector unit comprises optical sensors to detect light signals produced from the markings.

13. The encoder of claim 12, wherein the detector unit further comprises a source of optical radiation to illuminate the markings.

14. The encoder of claim 9, wherein the detector unit comprises mechanical sensors to detect the markings.

15. The encoder of claim 9, wherein the detector unit comprises magnetic sensors to magnetically detect the markings.

16. The encoder of claim 9, further comprising a quadrature channel on the marked region comprising quadrature markings separated by 4r.

17. The encoder of claim 16, wherein the detector unit comprises a first quadrature detector and a second quadrature detector, the first and second quadrature detectors being spaced in the detector unit by a separation corresponding to (2m+1)r along the marked region, where m is an integer.

18. The encoder of claim 9, wherein initial markings for adjacent channels are in positions staggered along the marked region.

19. The encoder of claim 9, wherein the processor unit comprises a direction decoder to receive signals from two quadrature detectors and to generate a clock signal and a direction signal.

20. The encoder of claim 9, wherein the processor unit comprises a pre-loadable up/down counter to receive the clock and direction signals, the up/down counter comprising index, first and second counters respectively associated with the index channel and the first and second channels, the index, first and second counters respectively receiving index, first, and second input signals from the detector unit indicating the detection of a marking on the index, first and second channels respectively.

21. The encoder of claim 20, wherein the first and second counters are preloadable with at least a portion of an index counter output in response to the first and second input signals respectively.

22. The encoder of claim 20, wherein the up/down counter generates an encoded output, and the processor unit further comprises a decoder to generate an absolute position signal in response to the encoded output from the up/down counter, and a display to display an absolute position in response to the absolute position signal.

23. An absolute linear encoder, comprising:

an encoded region having index markings evenly spaced by an index spacing and first counter markings having equal width less than the index spacing and being spaced apart by first counter spacings therebetween, at least half of the first counter spacings between first counter markings being of the same spacing distance unequal to the index spacing so that positions of an index marking and a first counter marking relative to a measuring location uniquely characterize a position of the measuring location along the encoded region;

a detector unit to detect marking positions along the encoded region; and a processor to determine absolute position from detected marking positions.

24. The absolute linear encoder according to claim 23, further comprising second counter markings with predetermined second counter spacings therebetween so that positions of the index markings, the first counter markings and the second counter markings relative to the measuring location uniquely characterize the position of the measuring location along the encoder.

25. The absolute linear encoder according to claim 23, further comprising quadrature markings evenly spaced along the encoder by a quadrature spacing.

26. A method of manufacturing a linear encoder, comprising the steps of:

positioning index markings along the encoder, the index markings being evenly spaced by an index spacing;

positioning first counter markings along the encoder, the first counter markings having a same width less than the index spacing and first counter spacings therebetween, at least half of the first counter spacings being of the same spacing distance different from the index spacing so that positions of index markings and the first counter markings relative to a measuring location uniquely characterize a position of the measuring location along the encoder; and providing a detector unit to detect marking positions and a processor to determine absolute position from detected marking positions.

27. An encoded region for use in an absolute linear encoder, comprising:

index markings evenly spaced by an index spacing along the encoded region; and first counter markings having a same width less than the index spacing and having first counter spacings therebetween along the encoded region, at least half of the first counter spacings between first counter markings being of the same spacing distance unequal to the index spacing so that positions of an index marking and a first counter marking relative to a measuring location uniquely characterize a position of the measuring location along the encoded region.

28. A method of manufacturing an encoded region for use in a linear encoder, comprising the steps of:

positioning index markings along the encoded region, the index markings being evenly spaced by an index spacing;

positioning first counter markings along the encoder, the first counter markings having a same width less than the index spacing and first counter spacings therebetween, at least half of the first counter spacings being of the same spacing distance different from the index spacing so that positions of index markings and the first counter markings relative to a measuring location uniquely characterize a position of the measuring location along the encoder.

* * * * *

UNITED STATES PATENT AND TRADEMARK OFFICE
CERTIFICATE OF CORRECTION

PATENT NO. : 5,825,307

DATED : OCTOBER 20, 1998

INVENTOR(S) : TITUS ET AL.

It is certified that error appears in the above-identified patent and that said Letters Patent is hereby corrected as shown below:

Col. 5, line 45: "ith" should read ---*i*th---

Col. 5, line 47: "ith" should read ---*i*th---

Col. 6, line 6: "ith" should read ---*i*th---

Signed and Sealed this

Ninth Day of November, 1999

Attest:

Attesting Officer

Q. TODD DICKINSON

Acting Commissioner of Patents and Trademarks